United States Patent
Lopez et al.

(10) Patent No.: US 7,852,125 B2
(45) Date of Patent: Dec. 14, 2010

(54) SWITCHING CIRCUIT ARRANGEMENT

(75) Inventors: Toni Lopez, Aachen (DE); Reinhold Elferich, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/302,051

(22) PCT Filed: May 14, 2007

(86) PCT No.: PCT/IB2007/051806

§ 371 (c)(1),
(2), (4) Date: Nov. 24, 2008

(87) PCT Pub. No.: WO2007/138509

PCT Pub. Date: Dec. 6, 2007

(65) Prior Publication Data

US 2009/0102541 A1 Apr. 23, 2009

(30) Foreign Application Priority Data

May 29, 2006 (EP) .................................. 06114606
Sep. 4, 2006 (EP) .................................. 06120034

(51) Int. Cl.
*H03K 3/00* (2006.01)

(52) U.S. Cl. ..................... 327/108; 327/318; 327/319; 327/320

(58) Field of Classification Search ................ 327/108, 327/318–320
See application file for complete search history.

(56) References Cited

U.S. PATENT DOCUMENTS 4,438,356 A * 3/1984 Fleischer ................... 327/409
4,492,883 A * 1/1985 Janutka ..................... 327/377
4,634,903 A * 1/1987 Montorfano ................ 327/432
4,970,420 A * 11/1990 Billings ..................... 327/430
5,276,370 A * 1/1994 Nishiura et al. ............. 327/109
5,281,862 A * 1/1994 Ma ........................... 327/108
5,475,329 A * 12/1995 Jones et al. ................. 327/377
5,506,539 A * 4/1996 Kelly et al. ................. 327/379

(Continued)

FOREIGN PATENT DOCUMENTS

| GB | 2351860 A | 1/2001 |
| WO | 2004114509 A1 | 12/2004 |
| WO | 2005091502 A1 | 9/2005 |

OTHER PUBLICATIONS

Elferich R et al: "Impact of Gate Voltage Bias on Reverse Recovery Losses of Power MOSFETs" Applied Power Electronics Conference and Exposition, 2006. APEC '06. Twenty-First Annual IEEE Mar. 19, 2006, pp. 1390-1395, XP010910127 ISBN: 0-7803-9547-6.

Thomas Duerbaum, et al: Quantification of Switching Loss Contributions in Synchronous Rectifier Applications, 10th European Conf. on Power Electronics and Applications EPE, Sep. 2003, paper 786.

G.M. Dolny, et al: The Influence of body effect and treshold voltage reduction on trench MOSFETN body diode characteristics, ISPSD 2004, pp. 217-220.

(Continued)

*Primary Examiner*—Kenneth B. Wells

(57) ABSTRACT

A switching circuit arrangement includes a field effect transistor and circuitry for biasing the gate voltage of the field effect transistor, e.g., forcing the gate voltage of the field effect transistor under a certain threshold. Reverse recovery and gate bounce are simultaneously mitigated. The biasing circuitry includes a biasing diode connected in series to the gate of the field effect transistor to bias the gate voltage of the field effect transistor. A clamping field effect transistor unit is connected between the gate of the field effect transistor and the source of the field effect transistor to force the gate voltage of the field effect transistor under a certain threshold.

11 Claims, 7 Drawing Sheets

U.S. PATENT DOCUMENTS

| | | | |
|---|---|---|---|
| 5,612,582 | A | 3/1997 | Shichi et al. |
| 5,929,690 | A | 7/1999 | Williams |
| 6,127,746 | A * | 10/2000 | Clemente .................... 307/131 |
| 6,421,262 | B1 | 7/2002 | Saxelby et al. |
| 6,819,149 | B2 | 11/2004 | Shirasawa et al. |
| 7,113,412 | B2 * | 9/2006 | Shao et al. .................... 363/18 |
| 7,439,636 | B2 * | 10/2008 | Lewis .......................... 307/117 |
| 2005/0047177 | A1 | 3/2005 | Tobita |

OTHER PUBLICATIONS

Thomas Duerbaum, et al: Third Quadrant Output Characteristics in High Density Trench MOSFETs, 11th International Power Electronics and Motion Control Conf. EPE-PEMC, Sep. 2004, Riga, Latvia, paper A14370.

Philip Rutter: Challenges of integrated Power Trains, Intel Symposium 2004.

PIP212-12M Oct. 24, 2006 http://www.semiconductors.philips.com/pip/PIP212-12M.html.

* cited by examiner

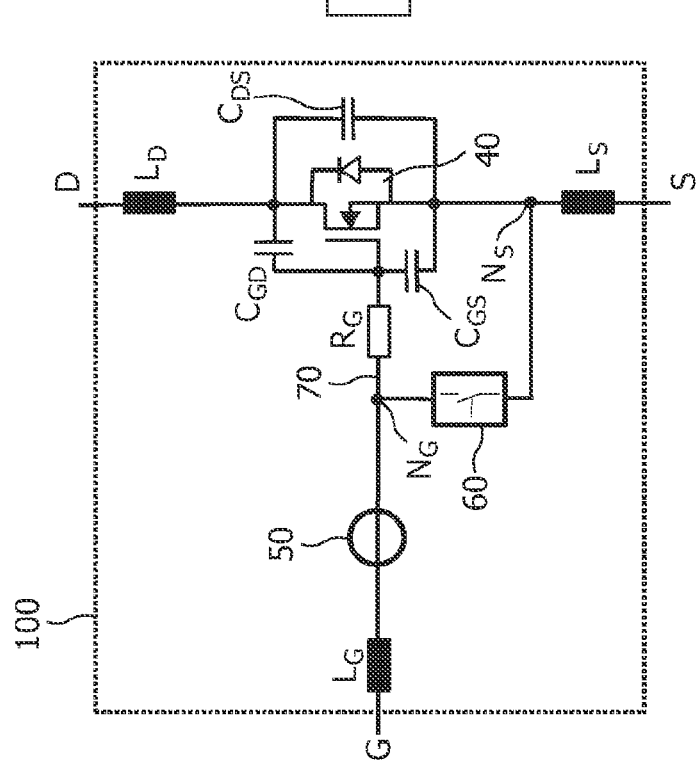
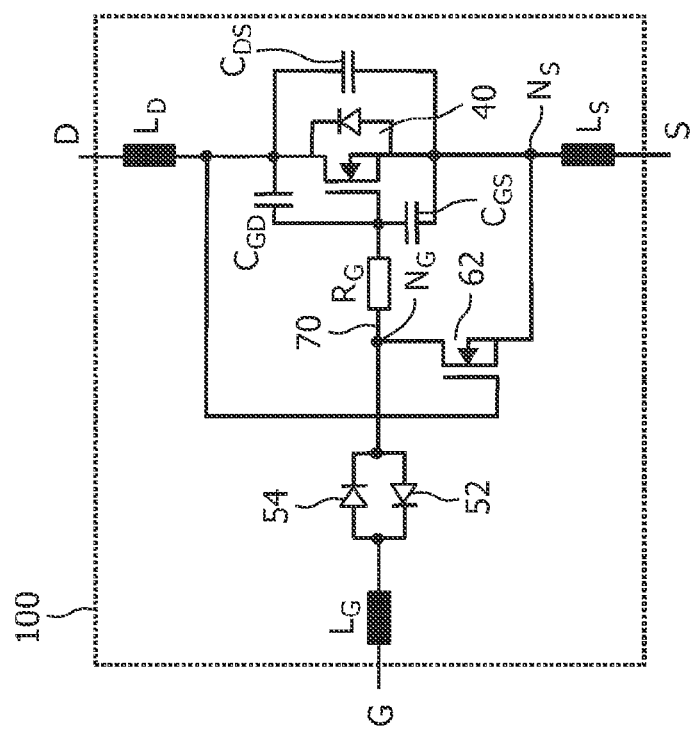
FIG. 2A
FIG. 2B

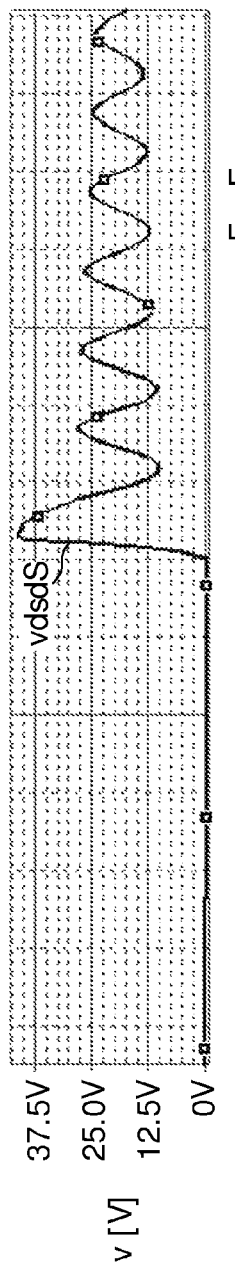
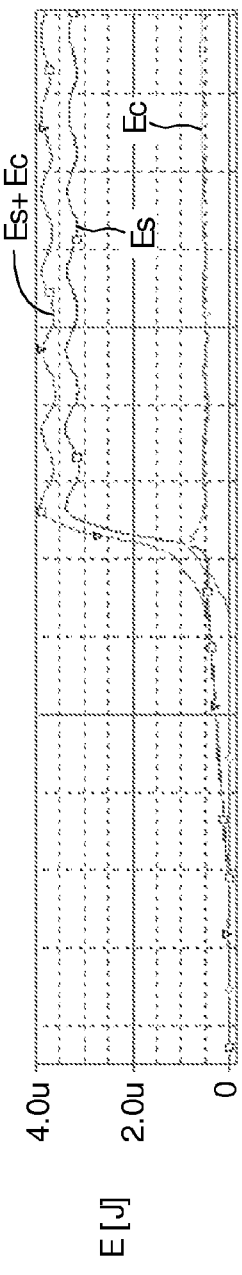
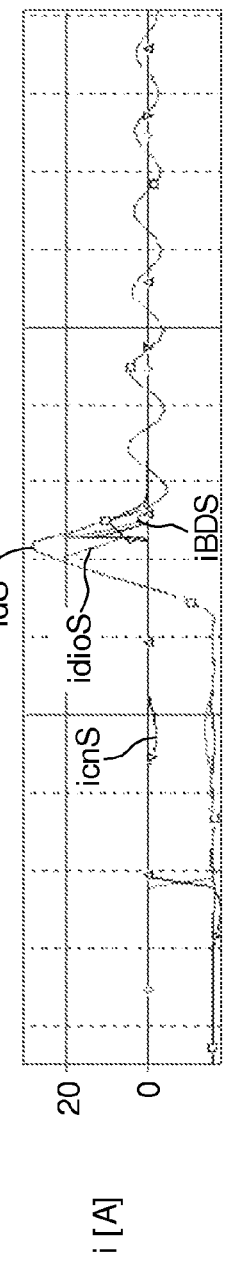
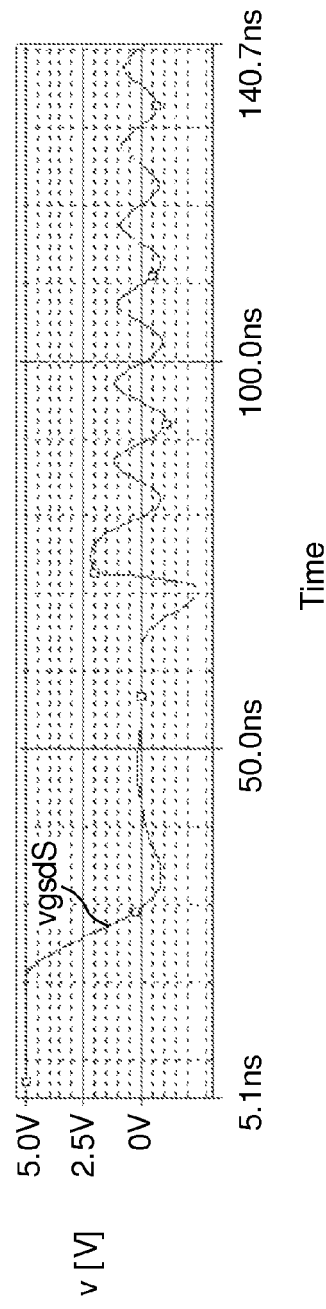
FIG. 3A
FIG. 3B
FIG. 3C
FIG. 3D

SWITCHING CIRCUIT ARRANGEMENT

FIELD OF THE INVENTION

The invention relates to switching circuit arrangement.

BACKGROUND OF THE INVENTION

High frequency power conversion is per se the most enticing solution to the demands for increasing high feedback control dynamics and reducing printed circuit board (PCB) space in low-voltage high-current applications, such as voltage regulator modules (VRMs) or point of load (PoL).

High switching frequency operation is however detrimental for the converter efficiency, which requires to be kept high especially in these applications. High efficiency is therefore a major obstacle for increasing the switching frequency operation. This in turn tremendously influences the design guidelines of the converter and particularly the switch devices, which have to feature both low conduction resistance and high switching performance.

The most extended converter topology in VRM and PoL applications is the synchronous buck. In this converter, two power switching loss mechanisms are of important relevance: reverse recovery and gate bounce of the synchronous rectifier metal-oxide-semiconductor field effect transistor (sync MOSFET or sync FET). See the article "Quantification of Switching Loss Contributions in Synchronous Rectifier Applications" by Thomas Duerbaum, Tobias Tolle, Reinhold Elferich and Toni Lopez, 10th European Conference on Power Electronics and Applications EPE, September 2003, Toulouse, France, paper 786. These two power switching loss mechanisms generate heat in both synchronous MOSFETs and control MOSFETs, thereby reducing the efficiency of the converter.

A well-known solution exists which mitigates reverse recovery by means of intelligent drivers with adaptive dead time control schemes. This solution has been proven to work effectively only in integrated modules. See for example information on the World Wide Web at semiconductors.philips.com/pip/PIP212-12M.html, and prior art article "Challenges of Integrated Power Trains" by Philip Rutter, Intel Symposium 2004.

Another more recent solution, see WO 2004/114509 A1, although particularly meant for reduction of electromagnetic interference (EMI), takes advantage of the so-called "body effect" present in MOSFETs. See also the article "The influence of body effect and threshold voltage reduction on trench MOSFET body diode characteristics" by G. M. Dolny, S. Sapp, A. Elbanhaway, C. F. Wheatley, ISPSD 2004, pages 217 to 220, or the article "Third Quadrant Output Characteristics in High Density Trench MOSFETs" by Thomas Duerbaum, Toni Lopez, Reinhold Elferich, Nick Koper, and Tobias Tolle, 11th International Power Electronics and Motion Control Conference EPE-PEMC, September 2004, Riga, Latvia, paper A14370, in order to effectively eliminate reverse recovery by means of series diodes added to the gate circuit.

Based on this idea a new FET device which integrates the series diodes and the MOSFET in a single package will become a product for the automotive industry, featuring low electromagnetic interference (EMI) switching behavior.

The above solutions, although mitigating reverse recovery, may worsen gate bounce. In case of this FET device, gate bounce can be so much worse that the overall power loss may become higher than that in a conventional solution in case of high switching frequency applications.

An eligible technique to minimize gate bounce aims at making a device structure with a low ratio of Crss (=miller feedback capacitance) to Ciss (=lumped input capacitance or stated input capacitance), i.e. a device comprising a low susceptibility to gate bounce. A low impedance gate path further helps minimize this lossy effect.

U.S. Pat. No. 5,929,690 proposes a device, which is optimized to exploit the "body effect" by means of modifying parameters of the semiconductor technology (oxide thickness, doping profile, . . . ) which may compromise other relevant device parameters, such as capacitances and the on-state drain-to-source resistance RDS (on). In this context, U.S. Pat. No. 5,929,690 proposes to lower the nominal threshold voltage to effectively exploit the "body effect". Apart from that, U.S. Pat. No. 5,929,690 completely neglects the gate bounce effect, which may significantly generate switching power losses in state of the art power MOSFETs, particularly when lowering the threshold voltage so as to exploit the "body effect". This is so much so, that the benefits of the "body effect" may not compensate the increase of the gate bounce related losses in prior art power MOSFETs.

Regarding the technological background of the present invention, reference can finally be made to U.S. Pat. No. 6,421,262 B1 proposing an active switch which is self-controlled, U.S. Pat. No. 6,819,149 B2 employing a timing control to minimize the voltage ringing at the switch node voltage of a half-bridge; this timing control causes spurious shoot-through, thereby generating extra losses in the switched circuit so as to reduce voltage ringing, US 2005/0047177 A1 which is exclusively applicable to A[lternating] C[urrent]/D[irect] C[urrent] converters for power mains, particularly to forward converters.

SUMMARY OF THE INVENTION

It is, inter alia, an object of the invention to provide an improved switching circuit arrangement. The invention is defined by the independent claims. Advantageous embodiments are defined by the dependent claims.

Particular embodiments result in that reverse recovery as well as gate bounce are simultaneously mitigated, ideally avoided.

Embodiments of the present invention is principally based on the idea of at least one low side gate circuit for the suppression of reverse recovery related losses as well as of gate bounce related losses. To this aim, at least one gate voltage biasing means to drive a synchronous rectifier (SR) metal-oxide-semiconductor field effect transistor (MOSFET) into the sub-threshold region and thus to avoid reverse recovery is combined with at least one clamping switch means preventing the power device from switching on unwantedly when the switch node voltage ramps up.

Unlike conventional proposals, particular embodiments of the present invention provide a way to avoid reverse recovery and gate bounce simultaneously. As a consequence, energy loss and electromagnetic interference (EMI) can be reduced. Further, low ohmic gate drivers are no longer required to minimize gate bounce, neither are drive schemes with stringent timing control to eliminate reverse recovery. The proposed solutions lead to a well-defined switching pattern behavior in which the maximum voltage peak across the devices can simply be determined, which helps optimize the avalanche break down level of the switches.

The proposed true-soft switching synchronous rectifying means can be integrated in a single package without requiring additional pins. Multi-chip modules can also benefit from the present invention.

In more detail, at least one clamping switch at the gate circuit of the synchronous rectifying (low side) MOSFET provides a low impedance path between the gate terminal and the source terminal in order to prevent the gate voltage from rising during dv/dt transition, with dv/dt being the first derivative of the voltage with respect to time.

According to a particular refinement of the present invention the gate of this clamping switch is connected to the drain of the main (rectifying) switch in order to prevent gate bounce.

In a preferred embodiment of the present invention at least two diodes are added to the gate drive wherein one diode provides for biasing the gate drive above zero volts, and the other diode provides a current path for turn-on in order to eliminate losses due to body diode reverse recovery.

Accordingly, an embodiment of the present invention may be based on the connection of at least one series diode in the gate of the MOSFET, similarly to what has already been proposed in document WO 2004/114509 A1 for minimizing reverse recovery and electromagnetic interference (EMI). Yet, unlike WO 2004/114509 A1, embodiments of the present invention do not worsen but mitigate gate bounce.

Alternatively, such turn-on path diode is not required if the biasing diode is implemented in the driver.

The solution according to certain embodiments of the present invention may be integrated within the package of the metal-oxide-semiconductor field effect transistor (MOSFET), keeping the same number of pins, i.e. drain pin, gate pin, source pin. This avoids the need of external circuitry or complex driving schemes. Further, this allows for a more flexible device structure design, as the capacitance between the gate terminal and the drain terminal of the synchronous rectifier (SR) becomes less critical, and avalanche break down level can be well defined. Thus, other parameters of the MOSFET may be further improved, for example the resistance between the drain terminal and the source terminal of the synchronous rectifier (SR) in the on-state.

The benefits of preferred embodiments of the present invention can be summarized as follows:

significant reduction of switching losses at the leading edge transition;

reduction of electromagnetic interference (EMI);

in prior art power MOSFETs, the maximum voltage peak across the synchronous field effect transistor (sync FET) determined to be approximately lower than or equal to 2.5 times the input voltage of the buck converter; thus, the device can be designed to that level in order to avoid avalanche break down losses; this cannot be ensured as long as reverse recovery occurs;

non critical gate drive timing required;

low current, high impedance conventional gate drivers can be used;

miller feedback capacitance Crss turns out to be not so critical; thus, the tradeoffs related to optimisation of parameters are reduced;

discrete solution with three pins, namely drain pin, gate pin, source pin

Embodiments of the present invention may especially be used in applications, such as voltage regulator modules (VRMs) or point of load (PoL), for example in power supplies for notebook personal computers (PCs), in graphic cards and in semiconductor related products, such as in integrated power train modules, like the fully optimized power train module or power output stage for a high current high frequency synchronous buck D[irect] C[urrent]-to-D[irect]C[urrent] converter application.

Embodiments of the present invention may target at both integrated solutions and discrete solutions, as well as different synchronous rectifier converters, like the synchronous buck and the boost converter.

Embodiments of the present invention mitigate two of the most relevant switching loss mechanisms present in synchronous buck converters as well as in boost converters, namely reverse recovery and gate bounce. The reduction of switching losses leads to a better converter efficiency, which is of great benefit in high frequency, high-current applications, such as voltage regulator modules (VRMs) or point of load (PoL).

These and other aspects of the invention will be apparent from and elucidated with reference to the embodiments described hereinafter.

BRIEF DESCRIPTION OF THE DRAWINGS

FIG. 2A schematically shows a principle circuit diagram of an embodiment of a synchronous rectifier switch for high efficient converters according to the present invention being operated according to the method of the present invention;

FIG. 2B schematically shows a more detailed principle circuit diagram of the synchronous rectifier switch for high efficient converters of FIG. 2A;

FIGS. 3A, 3B, 3C, 3D schematically show a respective principle operation diagram of an embodiment of the synchronous buck converter with respect to the leading edge transition.

DESCRIPTION OF EMBODIMENTS

Figure 1A:
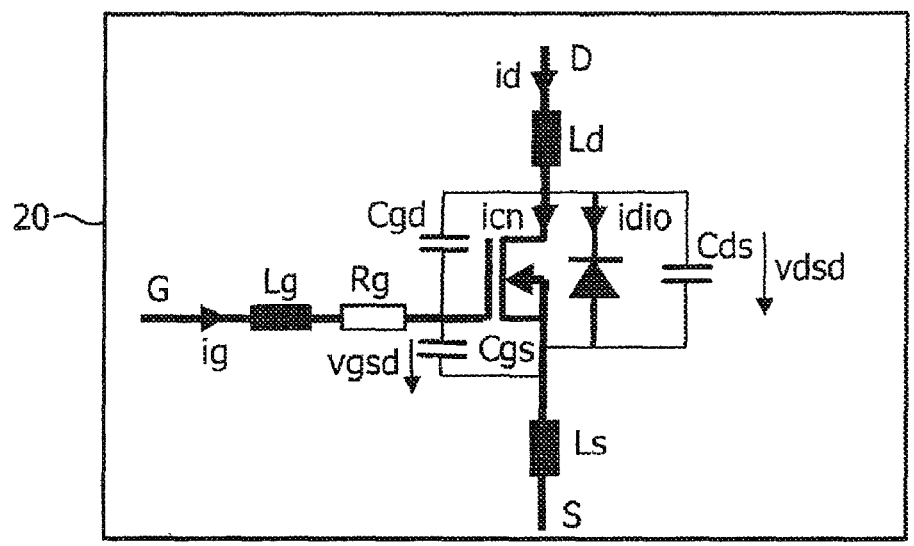
FIG. 1A schematically shows a principle circuit diagram of an embodiment of a synchronous buck converter.
Figure 1A:
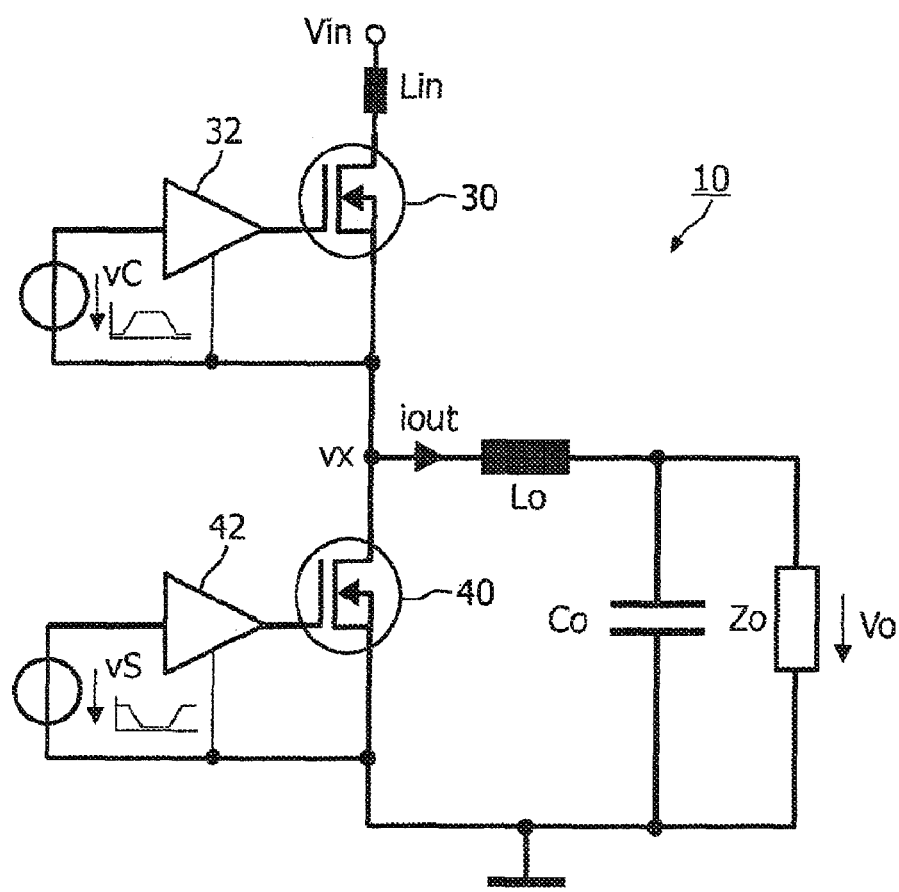

The same reference numerals are used for corresponding parts in FIG. 1A to FIG. 4D.

Figure 1B:
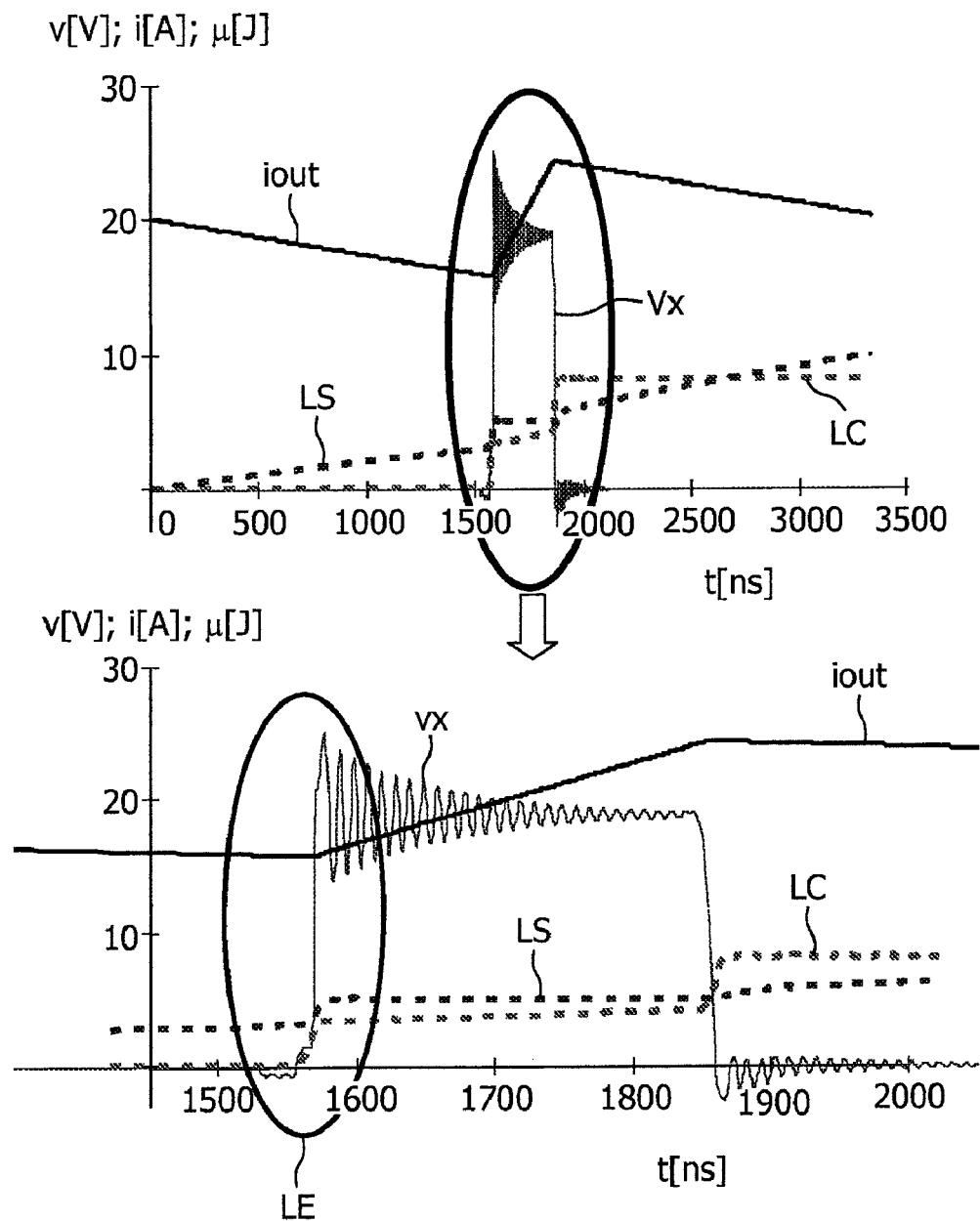
FIG. 1B schematically shows a principle operation diagram of the synchronous buck converter of FIG. 1A, wherein the waveforms refer to a certain application example.
Figure 1C:
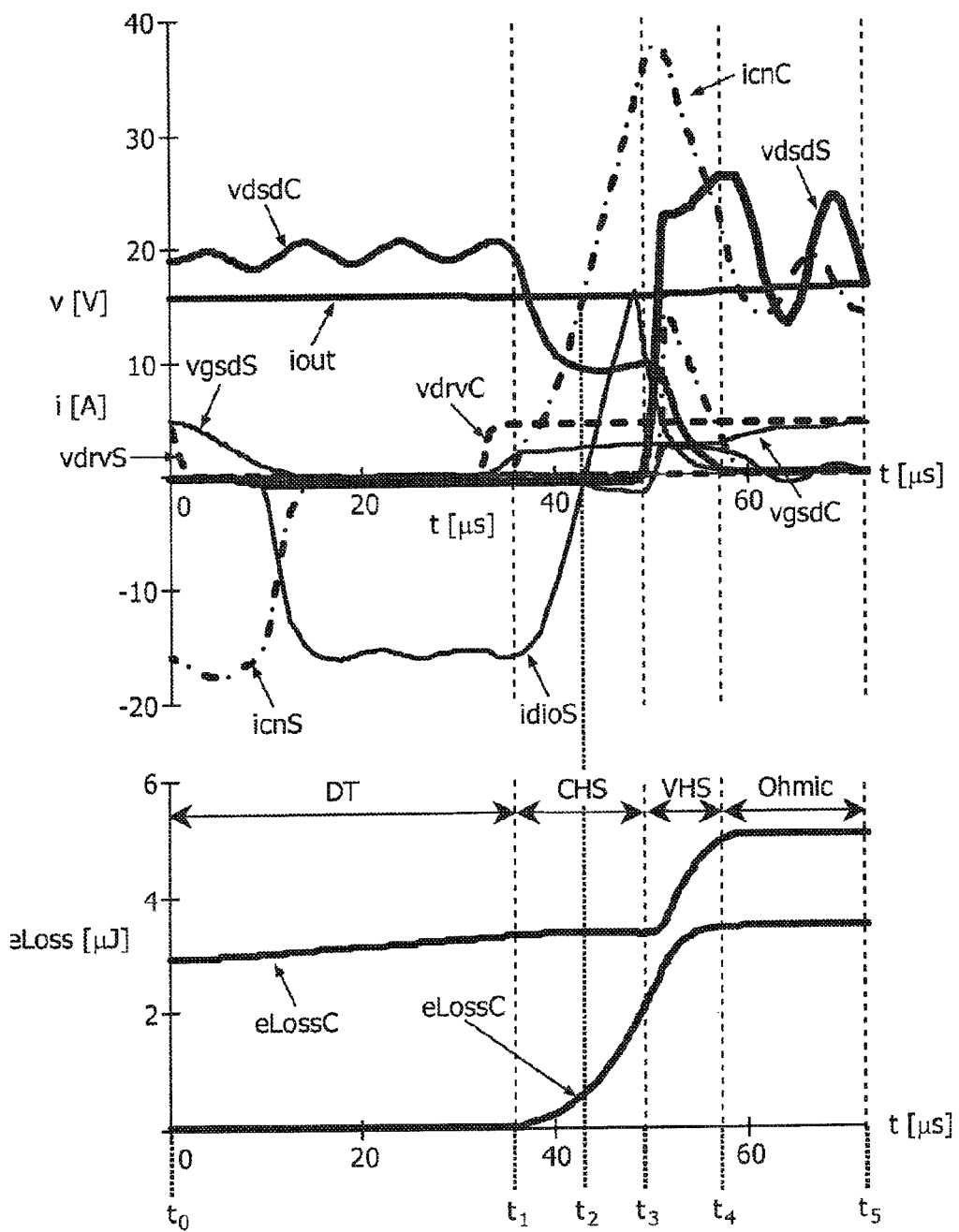
FIG. 1C schematically shows a principle operation diagram of the synchronous buck converter of FIG. 1A with respect to the leading edge transition, wherein the names in the legend refer to FIGS. 1A, 1B with letter C in the legend referring to the traces of the control field effect transistor unit and with letter S in the legend referring to the traces of the synchronous field effect transistor unit.

In order to better understand the proposed solution according to the present invention the insights of the synchronous buck operation are presented in FIG. 1A, in FIG. 1B and in FIG. 1C by way of example. FIG. 1A shows the circuit arrangement, FIG. 1B and FIG. 1C show the operation diagrams of such synchronous buck converter 10 including the model of the metal-oxide-semiconductor field effect transistor (MOSFET with reference numeral 20).

The energy waveforms in FIG. 1B illustrate the loss pattern LS of the synchronous buck converter 10. High losses occur during the switching transients, especially in the control field effect transistor 30.

A closer look at the leading edge transition LE of the switching node voltage Vx in FIG. 1C reveals the presence of an over current peak through the channel of the control field effect transistor 30 (<- - - > trace icnC in FIG. 1C) being responsible for substantial losses LC, LS in both switches, i.e. for substantial losses LC in the control field effect transistor unit 30, and for substantial losses LS in the synchronous field effect transistor unit 40.

This current peak in FIG. 1C results from basically three effects:

reverse conduction of the body diode of the synchronous field effect transistor 40 (<- - - > trace idioS in FIG. 1C);

channel conduction of the synchronous field effect transistor 40 due to gate bounce (<- - - > trace icnS in FIG. 1C); and capacitive current.

The embodiment according to the present invention proposes the mitigation of the first two current components by means of modifying the gate drive 42 of the synchronous field effect transistor 40. The proposed solution can be integrated in the same device package, as shown in the diagram of FIGS. 2A and 2B, in which the most relevant parasitic components are shown.

The new synchronous field effect transistor 40 can be implemented as a true-soft switching synchronous rectifier (true-soft switching SR) because it is intended to switch at zero losses, i.e.

with zero reverse recovery related losses, with zero gate bounce related losses, and with zero avalanche break down related losses.

Basically, a sub-threshold gate voltage being slightly above zero Volt (for instance 0.5 Volt in devices with typical threshold voltages of 1.5 Volt) is applied. In doing so, the characteristics, especially the dynamic behavior, of the body diode improve substantially up to the point that the reverse recovery current is no longer observed from the external pins.

Such elimination of body diode reverse recovery is implemented as a first embodiment by adding a diode 52 in the gate path 70 in such way that this diode 52 is forward biased at turning off the synchronous field effect transistor 40 (cf. FIG. 2B showing the true-soft switching synchronous rectifier).

During this phase, and using a proper external gate resistance $R_{GX}$, the input capacitance of the power MOSFET discharges down to the forward conduction voltage of the included gate diode, thereby providing a biasing voltage means 50 being in the desired sub-threshold level. A diode 54 being anti-parallel to biasing diode 52 is also used to allow for a turn-on current path in the gate.

Gate bounce related losses start when the drain-to-source voltage of the synchronous field effect transistor unit (=sync FET with reference numeral 40) rises up, as depicted in FIG. 1C. The large dv/dt (=derivative of voltage v against time t) causes a current through the gate-to-drain capacitance $C_{GD}$ (=reverse transfer capacitance between the gate G and the drain D), said current forcing the gate voltage to increase until the channel turns on and losses occur.

In order to mitigate the rise of the gate voltage during the dv/dt transition an alternative low impedance path 70 is included in parallel to the gate-to-source capacitance $C_{GS}$ (=capacitance between the gate G and the source S) (cf. FIG. 2A showing the true-soft switching synchronous rectifier).

This low impedance path 70 is active as soon as the drain-to-source voltage starts rising. As a first embodiment, a MOSFET switch 62 is used to implement the low impedance path 70, as shown in FIG. 2B. The switch 62 acts as a clamping means 60 (see FIG. 2A) for the gate voltage of the power switch 40. The gate of the clamping switch 62 is connected to the drain D of the power switch 40.

As soon as the drain-to-source voltage of the power switch 40 rises above the threshold of the clamping switch 62, this clamping switch 62 turns on, thereby shorting automatically the gate path 70 when the gate bounce phase starts. The effectiveness of the present invention with regard to the mitigation of gate bounce strongly depends on gate resistance $R_{GX}$ of the power switch 40.

The clamping switch means 60, in particular the clamping field effect transistor unit 62 as shown in FIGS. 2A, 2B, is designed to force the gate voltage to be under the threshold level as soon as the switch node voltage starts rising.

Unlike U.S. Pat. No. 6,421,262 B1 where the clamping switch is used to turn the power switch off whenever the drain-to-source voltage in the power switch is positive, in the present embodiment of the invention the use of the clamping switch 60 is to provide a low ohmic gate path 70 to avoid gate bounce and thus to keep the device in off-state; in other words, the clamping switch 60 does not turn the power device off but keeps the power device in off-state. This implies two main differences with respect to U.S. Pat. No. 6,421,262 B1, namely the control strategies for the clamping switch 60, and the sensing means of the drain-to-source voltage of the power switch.

The clamping switch 60 presents the following characteristics:

low drain-to-source resistance $R_{DS}$ (on) in on-state, at least lower than the polysilicon gate resistance of the power MOSFET (device 40); the maximum benefit of the present invention is obtained with power MOSFETs featuring low gate resistance $R_G$ (cf. FIG. 1A, FIG. 2A, FIG. 2B);

low threshold voltage, preferably between 0.5 Volt and 1 Volt;

maximum gate voltage equal to the breakdown voltage of the power MOSFET;

N-channel.

In case a maximum gate voltage equal to the breakdown voltage of the power MOSFET cannot be easily achieved then the following options can be chosen:

use of a series capacitance in the gate of the clamping field effect transistor 62 to reduce the gate voltage of the clamping switch;

connection of the gate of the clamping field effect transistor 62 to the synchronous field effect transistor driver, i.e. the synchronous field effect transistor driver controls the clamping field effect transistor 62; in this case, an intelligent driver monitoring the switch node voltage is provided, in case of discrete solutions with a fourth pin (first gate, second gate, drain, source).

If the gate of the clamping field effect transistor 62 is connected to the drain D of the power MOSFET (cf. FIGS. 2A, 2B), then the output capacitance of the synchronous field effect transistor 40 is increased, which is beneficial at the switch node falling edge transition.

In the exemplary embodiment according to FIGS. 2A, 2B, it is to be ensured that the synchronous field effect transistor driver is in the off state as long as the drain-to-source voltage of the power MOSFET is higher than the threshold voltage of the clamping field effect transistor 62. Otherwise, there is the possibility of short-circuiting the gate drive 42, in particular the gate driver output with the clamping field effect transistor 62 in case of an accidental turn-on of the clamping field effect transistor 62. Although such accidental turn-on of the clamping field effect transistor 62 is prevented under normal operation, the gate driver 42 can be protected from short-circuit by means of standard short-circuit protection in the gate drive 42 and/or monitoring the switch node voltage.

By the gate voltage biasing means 50 a biasing voltage is implemented at the gate by means of diodes 52, 54; accordingly, an anti-parallel diode 54 is provided to allow for current flow in the opposite direction. The diodes 52, 54 can be placed in or out of the MOSFET package. The advantage of having the diodes 52, 54 inside the MOSFET package is that the dependence of the threshold voltage of the power MOSFET on temperature is compensated with the temperature dependence of the forward voltage of the diodes 52, 54.

If, on the other hand, the diodes 52, 54 are outside the MOSFET package, heat is better distributed, which can be important at high switching frequencies. The diode 54 for the turn-on path can be avoided if the biasing diode 52 is placed in the gate driver 42, as shown the FIG. 2C. The diode 54 for the turn-on path might be replaced by a voltage source $V_{DRV}$ so as to allow for energy recovery.

Parasitic inductances of the gate drive 42 cause the gate voltage to deviate from the biasing voltage level, and thus such parasitic inductances, especially the source inductance, should be reduced, or otherwise the resistance of the gate path 70 should be increased in order to minimize their effects. Such increase of the resistance of the gate path 70 can be realized by means of external resistance $R_{GX}$, as shown in FIG. 2C, or in series with the biasing diode 52 in such way that the turn-on path does not present such high resistance.

In order to avoid a high impedance turn off path the clamping switch 60, 62 is arranged in parallel to the gate and to the source of the power switch in a way that the impedance of the turn-off path is minimized, for example by integrating the clamping switch 60 in the die of the power switch. The inductances $L_G$ and $L_S$ of FIGS. 2A, 2B represent the parasitic inductance of the package.

Figure 2C:
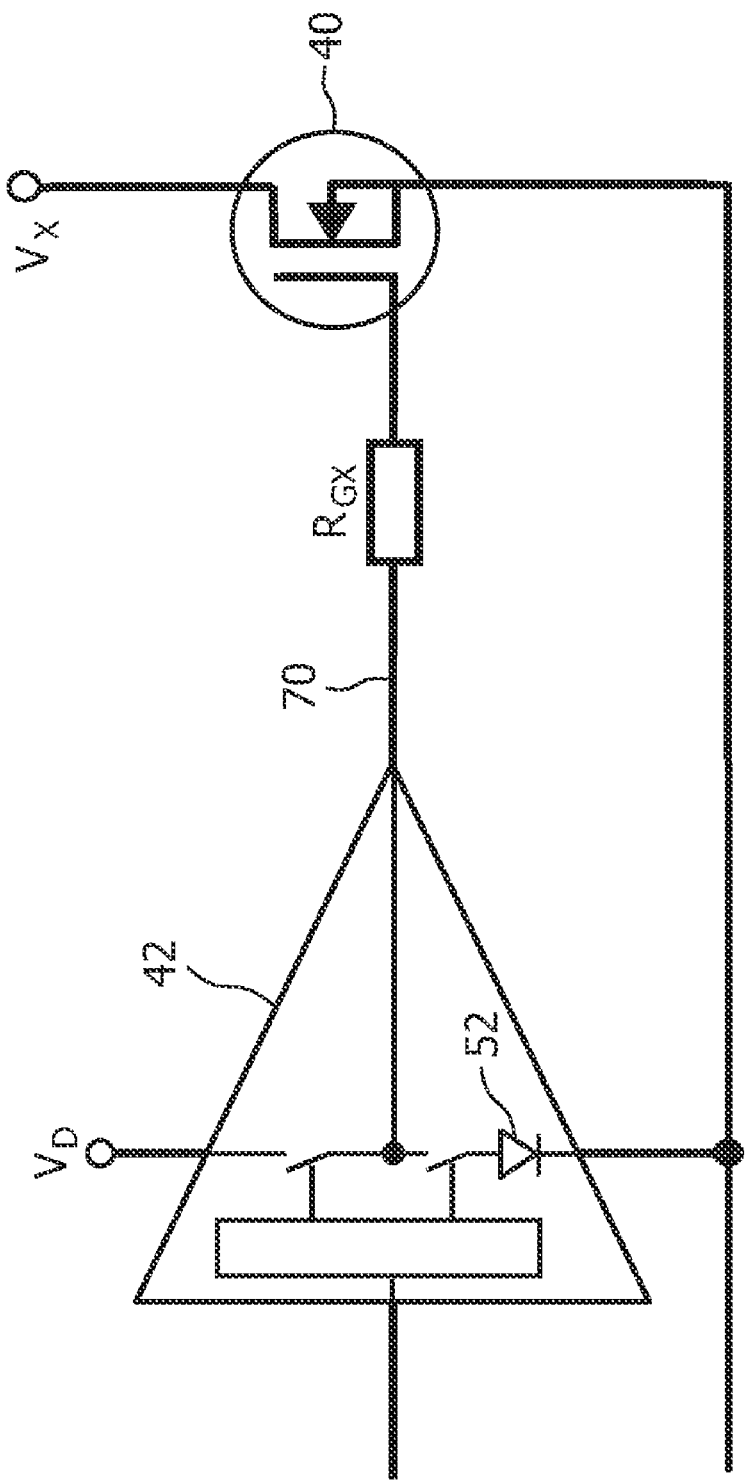
FIG. 2C schematically shows a principle circuit diagram of an embodiment of a gate biasing diode incorporated in the gate driver, wherein the diode for the turn-on path is not required.
Figure 4A:
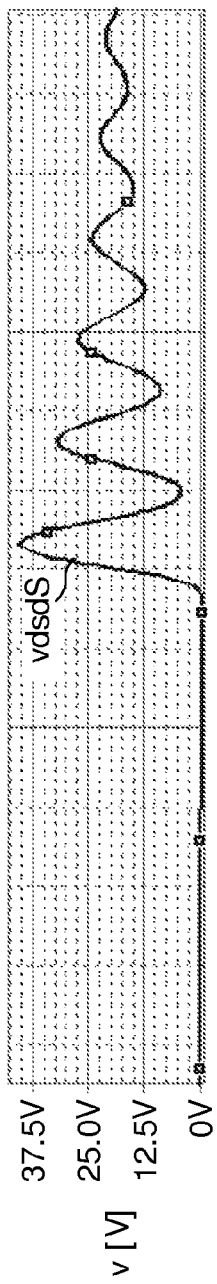
FIGS. 4A, 4B, 4C, 4D schematically show a respective principle operation diagram of an embodiment of the synchronous buck converter according to the present invention.
Figure 4B:
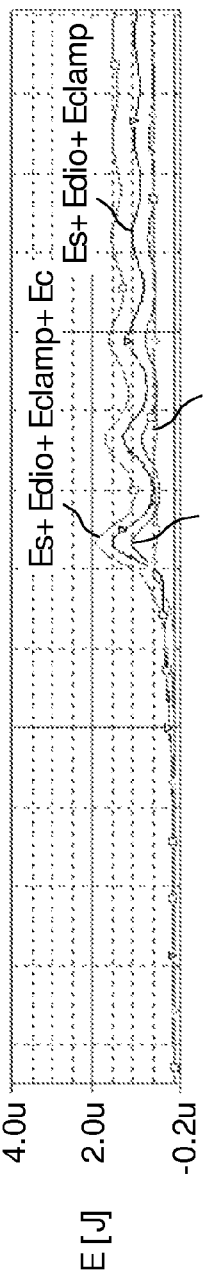
Figure 4C:
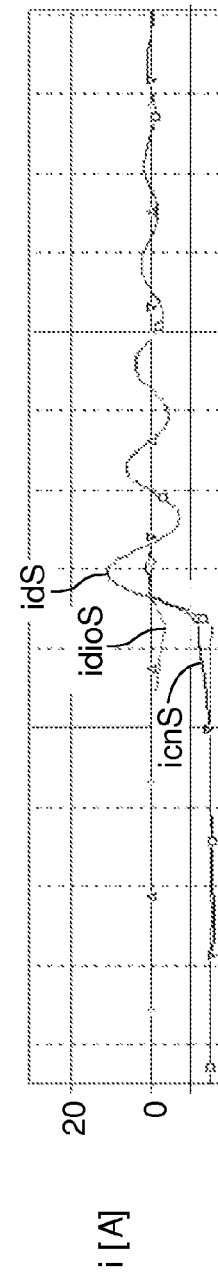
Figure 4D:
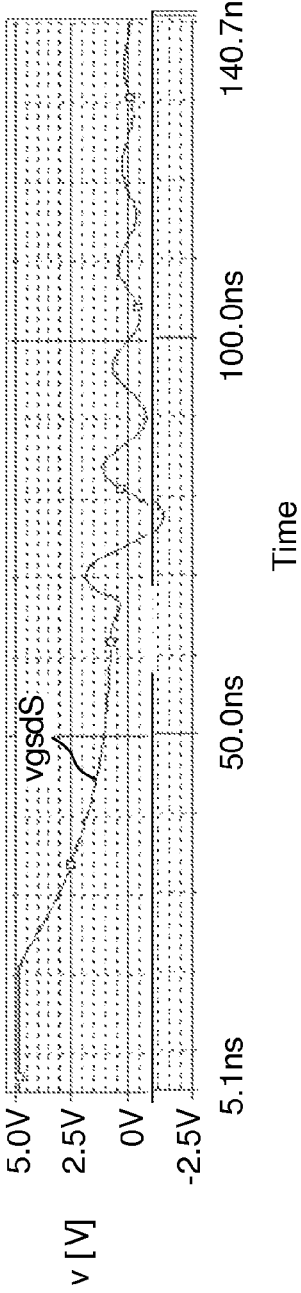

Further, it is to be distinguished between the impedance path 70 of FIGS. 2A, 2B and the impedance path 70 of FIG. 2C insofar as the impedance path 70 of FIG. 2C should be higher compared to the impedance path 70 of FIGS. 2A, 2B. In this context, internal nodes $N_G$, $N_S$ can be defined at the die in FIGS. 2A, 2B, and the clamping switch 60, 62 is connected between internal gate die node $N_G$ and the internal source die node $N_S$ so as to avoid the parasitic impedances of the package.

All in all, it can be taken from FIG. 2B that three new components are added to a conventional MOSFET, namely
a first diode 52 for biasing the gate voltage above zero Volts,
a second diode 54 providing a current path for turn-on, and
the clamping field effect transistor 62.

Accurate simulations are used to compare the performance of the true-soft switching synchronous rectifier device in FIGS. 2A, 2B, 2C with a conventional synchronous field effect transistor. FIGS. 3A, 3B, 3C, 3D show the diagram of operation of a synchronous buck converter during the switch node leading edge transition LE.

The following is a list of the relevant parameters concerning the gate drive path 70 of the synchronous field effect transistor 40:
gate resistance $R_G$: 0.5 Ohm;
source inductance $L_S$: 600 pH (p=pico=$10^{-12}$; H=Henry);
total gate inductance (source inductance $L_S$ not included): 2.4 nH (n=nano=$10^{-9}$).

The gate drivers are modeled to be conventional with predefined dead times of 40 ns in both edges.

Looking at the simulated waveforms of FIGS. 3A, 3B, 3C, 3D it can be seen that the major energy loss occurs during the first voltage rise in vdsdS. During this time interval three major loss mechanisms in the synchronous field effect transistor contribute to power losses:

reverse recovery,
gate bounce, and
break down

The energy loss in both control field effect transistor 30 and synchronous field effect transistor 40 in said time interval is about 3.9 Microjoule (=3.9 Watt at a switching frequency of 1 Megahertz).

FIGS. 4A, 4B, 4C, 4D show the simulation results of a synchronous buck converter using a true-soft switching synchronous rectifier MOSFET 100 according to an embodiment of the present invention. The parameters of the circuit arrangement (including the control MOSFET 30 and the synchronous MOSFET 40) are adjusted to the values applied in the simulation of FIGS. 3A, 3B, 3C, 3D, except that external resistor $R_{GX}$ (cf. FIG. 2C) equals to 2.5 Ohm, which is used in the gate path 70 of the synchronous MOSFET 40 helping damp the inductive effects. The clamping FET used is ten times smaller than the power FET (, i.e. about a 60 Milliohm switch); its threshold voltage is adjusted to 1 Volt. The diodes are just conventional for general use, with a low parasitic capacitance.

As can be taken from FIGS. 4A, 4B, 4C, 4D the results of the simulation show that the present embodiment effectively eliminates diode reverse recovery and practically eliminates gate bounce related losses. As a consequence, the overall loss energy in the interval of the leading edge LE is significantly reduced from 3.9 mJ down to 1.5 mJ, including the losses of the biasing diode 52 and of the clamping field effect transistor 62.

Furthermore, the drain-to-source voltage and drain current peaks are minimized, thereby improving the avalanche break down susceptibility as well as reducing electromagnetic interference (EMI).

In order to ensure full operability of the embodiment according to the present invention,
gate resistance $R_G$ of the power switch and the clamping switch 60 should be as low as possible, and/or
the maximum gate voltage of the clamping switch 60 should be as high as the avalanche break down voltage of the power switch, and/or
the drain of the clamping switch 60 should be connected to the gate of the power switch when integrating the clamping switch 60, and/or
a certain gate resistance should be provided in the gate path 70 in order to mitigate inductive effects.

All in all, a gate circuit means for a power device with optimized drain-to-source resistance $R_{DS}$ (on) in on-state as well as with other optimized relevant parameters, such as the ratio $C_{GD}/(C_{GS}+C_{GD})$, as well as a corresponding operating method are proposed by the present embodiment of the invention ($C_{GD}$ is the reverse transfer or gate-to-drain capacitance; $C_{GS}$ is the gate-to-source capacitance).

Effectively, in the present embodiment of the invention the "body effect" in state of the art power MOSFETs is exploited without lowering the nominal threshold voltage (typically of about 2 Volt). Additionally, the issue of gate bounce is addressed by the present invention wherein a circuit arrangement 100 is proposed mitigating said gate bounce and, at the same time, exploiting the "body effect" in order to eliminate reverse recovery and improve on conduction.

In this context, the combination of three aspects is crucial:
gate biasing means to exploit the "body effect",
clamping means to avoid the gate bounce, and
the sequence of operation None of these three aspects are cited in U.S. Pat. No. 5,929,690 exploiting the "body effect" to reduce power losses.

However, such reduction of power losses alone is not sufficient in state of the art power MOSFETs as it even worsens gate bounce related losses. The technical measures applied in preferred embodiments of the present invention, namely elimination of reverse recovery,
improvement on conduction, and
avoidance of gate bounce are shown to be effective to considerably reduce and even to minimize power losses, independently on the switch node ringing.

In summary, a switching circuit arrangement (100) comprises a field effect transistor (40) and circuitry (50, 52, 54, 60, 62) for biasing the gate voltage of the field effect transistor (40), in particular forcing the gate voltage of the field effect transistor (40) under a certain threshold, in particular under a certain positive threshold level. In embodiments, reverse recovery as well as gate bounce are simultaneously mitigated. In one embodiment, the biasing circuitry comprises a biasing diode (52) connected in series to the gate (G) of the field effect transistor (40) to bias the gate voltage of the field effect transistor (40), as well as a clamping field effect transistor unit (62) connected between the gate (G) of the field effect transistor (40) and the source (S) of the field effect transistor (40) to force the gate voltage of the field effect transistor (40) under a certain threshold, in particular under a certain positive threshold level.

In the claims, the field effect transistor (40) may in particular be at least one synchronous field effect transistor. The circuitry (50, 52, 54, 60, 62) for biasing the gate voltage of the field effect transistor (40) may in particular force the gate voltage of the field effect transistor (40) under a certain threshold, in particular under a certain positive threshold level. The biasing means (50, 52, 54) may in particular be at least one biasing diode (52), connected in series to the gate (G) of the field effect transistor (40), for biasing the gate voltage of the field effect transistor (40). The clamping switch means (60, 62) may in particular be at least one clamping field effect transistor unit (62), connected between the gate (G) of the field effect transistor (40) and the source (S) of the field effect transistor (40), for forcing the gate voltage of the field effect transistor (40) under a certain threshold, in particular under a certain positive threshold level. The second diode (54) may in particular be an anti-parallel diode and/or turn-on path diode, to allow for current flow in the opposite direction of the current flow through the biasing diode (52). The driver unit (42) may in particular be at least one gate drive, wherein the biasing circuitry can be arranged in the driver unit (42). The gate path (70) may in particular be a low impedance path, in parallel to the capacitance ($C_{GS}$) from the gate (G) of the field effect transistor (40) to the source (S) of the field effect transistor (40), for mitigating the rise of the gate voltage during dv/dt transition. The gate path (70) may become active as soon as the voltage from the drain (D) of the field effect transistor (40) to the source (S) of the field effect transistor (40) starts rising, in particular above a certain threshold. The gate resistor unit ($R_{GX}$) may be in series with, in particular externally of, the biasing diode (52) in such way that the path of the anti-parallel diode and/or turn-on path diode (54) does not include said gate resistor unit ($R_{GX}$), as shown in FIG. 5.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention may be implemented by means of hardware comprising several distinct elements, and/or by means of a suitably programmed processor. In the device claim enumerating several means, several of these means may be embodied by one and the same item of hardware. The mere fact that certain measures are recited in mutually different dependent claims does not indicate that a combination of these measures cannot be used to advantage.

LIST OF REFERENCE NUMERALS 100 true-soft switching synchronous rectifying means, in particular true-soft switching synchronous rectifier MOSFET
10 synchronous buck converting unit or synchronous buck converter
20 metal-oxide-semiconductor field effect transistor (MOSFET)
30 control field effect transistor unit
32 driver unit, in particular gate drive, of control field effect transistor unit 30
40 synchronous field effect transistor unit
42 driver unit, in particular gate drive, of synchronous field effect transistor unit 40
50 voltage biasing means, in particular gate voltage biasing means
52 first diode, in particular biasing diode, of voltage biasing means 50
54 second diode, in particular turn-on path diode, of voltage biasing means 50
60 clamping switch means or clamping switch unit, in particular MOSFET switch
62 clamping field effect transistor unit
70 gate path, in particular low impedance path
D drain of synchronous field effect transistor unit 40
G gate of synchronous field effect transistor unit 40
LC loss(es) or loss pattern of control field effect transistor unit 30
LE leading edge or leading edge transition of switching node voltage Vx
LS loss(es) or loss pattern of synchronous field effect transistor unit 40
$N_G$ internal gate die node
$N_S$ internal source die node
$R_{GX}$ gate resistance, in particular external gate resistor unit
S source of synchronous field effect transistor unit 40
Vx switch node voltage

The invention claimed is:

1. A switching circuit arrangement comprising:
a power field effect transistor;
biasing circuitry for biasing a gate voltage of the field effect transistor to force the gate voltage of the field effect transistor under a threshold level; and
a clamping field effect transistor having a gate which is directly connected to a drain of the power field effect transistor;
wherein the biasing circuitry comprises anti-parallel diodes connected between two nodes, the biasing circuitry including a first diode connected between the two nodes, and a second diode connected between the two nodes anti-parallel with the first diode.

2. The switching circuit arrangement as claimed in claim 1, wherein the clamping field effect transistor is connected between the gate of the power field effect transistor and a source of the power field effect transistor, the clamping field effect transistor being configured to become active and provide a reduced impedance path when a drain-to-source voltage of the power field effect transistor starts rising above the threshold level for forcing the gate voltage of the power field effect transistor under the threshold level.

3. The switching circuit arrangement according to claim 2, wherein the second diode is configured to allow for current flow in an opposite direction of a current flow through the first diode.

4. The switching circuit arrangement according to claim 1, further comprising a driver unit connected to the power field effect transistor, wherein the biasing circuitry is arranged in the driver unit.

5. The switching circuit arrangement according to claim 1, further comprising a gate path in parallel to a capacitance from the gate of the power field effect transistor to a source of the power field effect transistor for mitigating a rise of the gate voltage during dv/dt transition.

6. The switching circuit arrangement according to claim 5, wherein the gate path is active as soon as a voltage from a drain of the power field effect transistor to the source of the power field effect transistor starts rising.

7. The switching circuit arrangement according to claim 5, wherein the gate path is shorted as soon as a voltage from the drain of the power field effect transistor to the source of the field effect transistor rises above a certain threshold level of the clamping field effect transistor, with said clamping field effect transistor turning on.

8. The switching circuit arrangement of claim 1, wherein the first diode is configured to be forward biased at turning off of the field effect transistor, and wherein the second diode is configured to allow for a turn-on current path to the gate to turn on the field effect transistor field effect transistor.

9. The switching circuit arrangement of claim 1, wherein the threshold level is between 0.5 Volt and 1 Volt.

10. The switching circuit arrangement of claim 2, wherein the clamping field effect transistor when active has a resistance which is lower that than a gate resistance of the power field effect transistor.

11. The switching circuit arrangement of claim 2, wherein the power field effect transistor is in an off state as long as the drain-to-source voltage of the power field effect transistor is higher than the threshold voltage where the clamping field effect transistor becomes active.

* * * * *